(12) United States Patent
Lu et al.

(10) Patent No.: US 12,029,065 B2
(45) Date of Patent: Jul. 2, 2024

(54) DISPLAY DEVICE AND MANUFACTURING METHOD THEREOF AND DRIVING SUBSTRATE

(71) Applicant: BOE TECHNOLOGY GROUP CO., LTD., Beijing (CN)

(72) Inventors: Pengcheng Lu, Beijing (CN); Kuanta Huang, Beijing (CN); Xiaochuan Chen, Beijing (CN); Shengji Yang, Beijing (CN); Xue Dong, Beijing (CN); Hui Wang, Beijing (CN); Yanming Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 104 days.

(21) Appl. No.: 16/959,757

(22) PCT Filed: Aug. 23, 2019

(86) PCT No.: PCT/CN2019/102293
§ 371 (c)(1),
(2) Date: Jul. 2, 2020

(87) PCT Pub. No.: WO2021/035405
PCT Pub. Date: Mar. 4, 2021

(65) Prior Publication Data
US 2021/0408488 A1    Dec. 30, 2021

(51) Int. Cl.
*H10K 50/856* (2023.01)
*H10K 59/123* (2023.01)
(Continued)

(52) U.S. Cl.
CPC ......... *H10K 50/856* (2023.02); *H10K 59/123* (2023.02); *H10K 59/126* (2023.02);
(Continued)

(58) Field of Classification Search
CPC ............ H01L 51/5271; H01L 27/3248; H01L 27/3272; H01L 51/56
(Continued)

(56) References Cited

U.S. PATENT DOCUMENTS 5,592,318 A    1/1997  Majima et al.
5,830,787 A    11/1998 Kim
(Continued)

FOREIGN PATENT DOCUMENTS

CN    1530878 A     9/2004
CN    101833186 A   9/2010
(Continued)

OTHER PUBLICATIONS

U.S. Office Action in U.S. Appl. No. 16/916,671 dated Feb. 24, 2022.
(Continued)

*Primary Examiner* — Dzung Tran
(74) *Attorney, Agent, or Firm* — Collard & Roe, P.C.

(57) ABSTRACT

A display device, a manufacturing method thereof and a driving substrate are provided. The display device includes: a base substrate, an active area and an edge area; the active area includes a plurality of sub-pixels on the base substrate; each sub-pixel includes: a first reflecting electrode, a light-emitting element a second electrode layer, an insulating layer, a pixel circuit, and a storing capacitor. The edge area includes a plurality of second reflecting electrodes and a light shielding layer.

15 Claims, 10 Drawing Sheets

(51) Int. Cl.
  *H10K 59/126* (2023.01)
  *H10K 71/00* (2023.01)
  *H10K 59/12* (2023.01)
  *H10K 77/10* (2023.01)
(52) U.S. Cl.
  CPC ......... *H10K 71/00* (2023.02); *H10K 59/1201* (2023.02); *H10K 77/10* (2023.02)
(58) Field of Classification Search
  USPC ........................................................ 257/40
  See application file for complete search history.

(56) References Cited

U.S. PATENT DOCUMENTS

| | | | |
|---|---|---|---|
| 5,898,322 | A | 4/1999 | Kubota et al. |
| 5,960,268 | A | 9/1999 | Aihara |
| 6,040,208 | A | 3/2000 | Honeycutt et al. |
| 6,274,421 | B1 | 8/2001 | Hsu et al. |
| 6,580,094 | B1 | 6/2003 | Yamazaki et al. |
| 7,361,534 | B2 | 4/2008 | Pelella |
| 7,432,146 | B2 | 10/2008 | Yamamoto |
| 7,838,883 | B2 | 11/2010 | Yamazaki et al. |
| 8,017,945 | B2 | 9/2011 | Yamazaki et al. |
| 8,772,766 | B2 | 7/2014 | Yamazaki et al. |
| 9,023,678 | B2 | 5/2015 | Heo et al. |
| 9,236,408 | B2 | 1/2016 | Yamazaki |
| 9,401,112 | B2 | 7/2016 | Ohara et al. |
| 9,711,549 | B2 | 7/2017 | Yamazaki et al. |
| 9,721,509 | B2 | 8/2017 | Kim et al. |
| 9,748,292 | B2 | 8/2017 | Yamazaki |
| 9,859,439 | B2 | 1/2018 | Miyairi |
| 9,875,690 | B2 | 1/2018 | Wang et al. |
| 9,978,822 | B2 | 5/2018 | Ota |
| 10,050,062 | B2 | 8/2018 | Sasagawa et al. |
| 10,147,747 | B2 | 12/2018 | Toriumi et al. |
| 10,796,641 | B2 | 10/2020 | Yang et al. |
| 11,037,529 | B2 | 6/2021 | Wang |
| 11,183,550 | B2 | 11/2021 | Kodam et al. |
| 11,322,082 | B2 | 5/2022 | Hu et al. |
| 2002/0084463 | A1 | 7/2002 | Sanford et al. |
| 2002/0179908 | A1 | 12/2002 | Arao |
| 2003/0025659 | A1 | 2/2003 | Kondo et al. |
| 2003/0030144 | A1 | 2/2003 | Ono et al. |
| 2003/0153155 | A1 | 8/2003 | Wang et al. |
| 2004/0189625 | A1 | 9/2004 | Sato |
| 2005/0056832 | A1 | 3/2005 | Yamazaki et al. |
| 2005/0173761 | A1 | 8/2005 | Takafuji et al. |
| 2005/0245046 | A1 | 11/2005 | Takafuji et al. |
| 2006/0170634 | A1* | 8/2006 | Kwak .................. G09G 3/3233 345/92 |
| 2006/0205166 | A1 | 9/2006 | Shikiriyama |
| 2007/0013293 | A1 | 1/2007 | Cok |
| 2007/0164290 | A1 | 7/2007 | Yamazaki et al. |
| 2007/0295961 | A1* | 12/2007 | Kim .................... H01L 51/5271 257/40 |
| 2008/0142807 | A1 | 6/2008 | Choe et al. |
| 2008/0169757 | A1 | 7/2008 | Chang et al. |
| 2008/0191603 | A1 | 8/2008 | Kubota |
| 2008/0210928 | A1 | 9/2008 | Abe et al. |
| 2009/0114926 | A1 | 5/2009 | Yamazaki |
| 2009/0152625 | A1 | 6/2009 | Lee et al. |
| 2010/0025664 | A1 | 2/2010 | Park |
| 2011/0233553 | A1 | 9/2011 | Sakakura et al. |
| 2012/0007848 | A1 | 1/2012 | Han et al. |
| 2012/0105421 | A1 | 5/2012 | Tsai et al. |
| 2012/0235973 | A1 | 9/2012 | Yoo |
| 2013/0001601 | A1 | 1/2013 | Lee et al. |
| 2013/0328753 | A1 | 12/2013 | Tsuge |
| 2014/0034982 | A1 | 2/2014 | Yamazaki |
| 2014/0131717 | A1 | 5/2014 | Qi et al. |
| 2014/0159021 | A1* | 6/2014 | Song .................... H01L 51/5265 257/40 |
| 2014/0299867 | A1 | 10/2014 | Ono et al. |
| 2014/0312334 | A1 | 10/2014 | Yamazaki et al. |
| 2014/0361261 | A1 | 12/2014 | Choi et al. |
| 2014/0361276 | A1 | 12/2014 | Hsu et al. |
| 2014/0367652 | A1* | 12/2014 | Cho .................... H01L 51/5281 257/40 |
| 2015/0108470 | A1 | 4/2015 | Yamazaki et al. |
| 2015/0108475 | A1 | 4/2015 | Ando et al. |
| 2015/0115224 | A1 | 4/2015 | Kou |
| 2015/0270326 | A1 | 9/2015 | Hekmatshoartabari et al. |
| 2015/0348997 | A1 | 12/2015 | Sasagawa et al. |
| 2016/0172431 | A1 | 6/2016 | Huang et al. |
| 2016/0181350 | A1 | 6/2016 | Lee |
| 2016/0275870 | A1 | 9/2016 | Kimura et al. |
| 2016/0293105 | A1 | 10/2016 | Wang et al. |
| 2016/0322442 | A1 | 11/2016 | Lee et al. |
| 2016/0327842 | A1 | 11/2016 | Qiao et al. |
| 2016/0351589 | A1 | 12/2016 | Sasagawa et al. |
| 2016/0372711 | A1 | 12/2016 | Song et al. |
| 2017/0011685 | A1 | 1/2017 | Jeon |
| 2017/0047004 | A1 | 2/2017 | Yoon et al. |
| 2017/0092707 | A1 | 3/2017 | Wang |
| 2017/0193879 | A1 | 7/2017 | Wang |
| 2017/0229528 | A1* | 8/2017 | Ota .................... H10K 59/122 |
| 2017/0236885 | A1 | 8/2017 | Koshihara et al. |
| 2017/0301293 | A1 | 10/2017 | Zhu et al. |
| 2018/0097047 | A1* | 4/2018 | Jung .................... H10K 59/123 |
| 2018/0102092 | A1 | 4/2018 | Kubota et al. |
| 2018/0151827 | A1* | 5/2018 | Kang .................. H01L 51/5284 |
| 2018/0212011 | A1* | 7/2018 | Lai .................... H01L 27/3258 |
| 2019/0148473 | A1* | 5/2019 | Yamazaki ............ H10K 50/171 313/504 |
| 2019/0251905 | A1 | 8/2019 | Yang et al. |
| 2019/0386074 | A1 | 12/2019 | Li et al. |
| 2020/0082757 | A1 | 3/2020 | Yuan et al. |
| 2021/0233968 | A1 | 7/2021 | Yang et al. |

FOREIGN PATENT DOCUMENTS

| | | |
|---|---|---|
| CN | 101980330 A | 2/2011 |
| CN | 102760841 A | 10/2012 |
| CN | 102983155 A | 3/2013 |
| CN | 103022079 A | 4/2013 |
| CN | 203026507 U | 6/2013 |
| CN | 103403787 A | 11/2013 |
| CN | 103440840 A | 12/2013 |
| CN | 103515413 A | 1/2014 |
| CN | 104025707 A | 9/2014 |
| CN | 104201190 A | 12/2014 |
| CN | 104240633 A | 12/2014 |
| CN | 104299572 A | 1/2015 |
| CN | 104332561 A | 2/2015 |
| CN | 104380368 A | 2/2015 |
| CN | 104681624 A | 6/2015 |
| CN | 105185816 A | 12/2015 |
| CN | 105225633 A | 1/2016 |
| CN | 204966501 U | 1/2016 |
| CN | 105304679 A | 2/2016 |
| CN | 106159100 A | 11/2016 |
| CN | 205789046 U | 12/2016 |
| CN | 107086237 A | 8/2017 |
| CN | 107103878 A | 8/2017 |
| CN | 107424570 A | 12/2017 |
| CN | 107591125 A | 1/2018 |
| CN | 107768385 A | 3/2018 |
| CN | 107799577 A | 3/2018 |
| CN | 109036279 A | 12/2018 |
| CN | 109119027 A | 1/2019 |
| CN | 109215549 A | 1/2019 |
| CN | 109509430 A | 3/2019 |
| CN | 109904347 A | 6/2019 |
| CN | 110071229 A | 7/2019 |
| EP | 1 096 571 A2 | 5/2001 |
| JP | H06-347828 A | 12/1994 |
| JP | 2000-315734 A | 11/2000 |
| JP | 2001-195016 A | 7/2001 |
| JP | 2001-332383 A | 11/2001 |
| JP | 2007-156058 A | 6/2007 |
| JP | 2008-153191 A | 7/2008 |
| JP | 2009-003435 A | 1/2009 |
| JP | 2009-016410 A | 1/2009 |

(56) References Cited

FOREIGN PATENT DOCUMENTS

| | | | |
|---|---|---|---|
| JP | 2009-036948 | A | 2/2009 |
| JP | 2011-181938 | A | 9/2011 |
| JP | 2015-076299 | A | 4/2015 |
| JP | 2017-142926 | A | 8/2017 |
| JP | 2020-012924 | A | 1/2020 |
| KR | 10-2008-0101732 | A | 11/2008 |
| KR | 20160027280 | A | 3/2016 |
| KR | 10-2016-0090176 | A | 7/2016 |
| KR | 10-1645404 | B1 | 8/2016 |
| KR | 10-2017-0005252 | A | 1/2017 |
| WO | 2014/036803 | A1 | 3/2014 |

OTHER PUBLICATIONS

First Indian Office Action in Indian Application No. 202017056357 dated Mar. 29, 2022 with English translation.
First Indian Office Action in Indian Application No. 202017056072 dated Apr. 7, 2022 with English translation.
U.S. Office Action in U.S. Appl. No. 16/814,119 dated Apr. 20, 2022.
Chinese Office Action in Chinese Application No. 201980001517.3 dated Sep. 1, 2021 with English translation.
U.S. Office Action in U.S. Appl. No. 16/916,671 dated Oct. 1, 2021.
Japanese Office Action in Japanese Application No. 2017-521204, mailed Jan. 20, 2021 with English translation.
First Office Action in U.S. Appl. No. 16/959,398 dated Nov. 26, 2021.
First Office Action in U.S. Appl. No. 16/812,619 dated Jan. 7, 2022.
English translation of the International Search Report of PCT/CN2016/101999, mailed Jan. 18, 2017, with English translation.
English translation of the Notice of Transmittal of the International Search Report of PCT/CN2016/101999, mailed Jan. 18, 2017.
International Preliminary Report on Patentability of PCT/CN2016/101999, issuance date Apr. 17, 2018 and English Translation of the Written Opinion of the International Searching Authority of PCT/CN2016/101999, mailed Jan. 18, 2017.
International Search Report of PCT/CN2019/102314 in Chinese, mailed May 27, 2020, with English translation.
Notice of Transmittal of the International Search Report of PCT/CN2019/102314 in Chinese, mailed May 27, 2020.
Written Opinion of the International Searching Authority of PCT/CN2019/102314 in Chinese, mailed May 27, 2020 with English translation.
International Search Report of PCT/CN2019/102293 in Chinese, mailed Apr. 26, 2020, with English translation.
Notice of Transmittal of the International Search Report of PCT/CN2019/102293 in Chinese, mailed Apr. 26, 2020.
Written Opinion of the International Searching Authority of PCT/CN2019/102293 in Chinese, mailed Apr. 26, 2020 with English translation.
International Search Report of PCT/CN2019/102307 in Chinese, mailed May 26, 2020, with English translation.
Notice of Transmittal of the International Search Report of PCT/CN2019/102307 in Chinese, mailed May 26, 2020.
Written Opinion of the International Searching Authority of PCT/CN2019/102307 in Chinese, mailed May 26, 2020 with English translation.
International Search Report of PCT/CN2019/102819 in Chinese, mailed May 26, 2020, with English translation.
Notice of Transmittal of the International Search Report of PCT/CN2019/102819 in Chinese, mailed May 26, 2020.
Written Opinion of the International Searching Authority of PCT/CN2019/102819 in Chinese, mailed May 26, 2020 with English translation.
Non-Final Office Action in U.S. Appl. No. 15/521,612 dated Jul. 6, 2018.
Non-Final Office Action in U.S. Appl. No. 15/521,612 dated Mar. 29, 2019.
Final Office Action in U.S. Appl. No. 15/521,612 dated Jan. 14, 2019.
Final Office Action in U.S. Appl. No. 15/521,612 dated Oct. 1, 2019.
English translation of Extended European Search Report in EP Application No. 16852868.5 mailed May 9, 2019.
Korean Office Action in Korean Application No. 10-2017-7009789, mailed Aug. 20, 2018 with English translation.
Korean Notice of Allowance in Korean Application No. 10-2019-7009729, mailed May 8, 2019 with English translation.
Japanese Search Report in Japanese Application No. 2017-521204 mailed Apr. 1, 2020 with English translation.
Japanese Office Action in Japanese Application No. 2017-521204, mailed Jun. 8, 2020 with English translation.
U.S. Office Action in U.S. Appl. No. 16/812,619 dated May 16, 2022.
Chinese Office Action in Chinese Application No. 201980001452.2 dated May 11, 2022 with English translation.
Extended European Search Report in European Application No. 19931503.7 dated May 30, 2022.
Extended European Search Report in European Application No. 19933233.9 dated Jul. 13, 2022.
Extended European Search Report in European Application No. 19932239.7 dated Aug. 1, 2022.
Extended European Search Report in European Application No. 19933232.1 dated Sep. 6, 2022.
Extended European Search Report in European Application No. 19933218.0 dated Nov. 16, 2022.
Japanese Office Action in Japanese Application No. 2022-512405 dated Apr. 24, 2023 with English translation.
Indian Notice of Hearing in Indian Application No. 202247009301 dated Feb. 26, 2024 with English translation.

\* cited by examiner

DISPLAY DEVICE AND MANUFACTURING METHOD THEREOF AND DRIVING SUBSTRATE

CROSS REFERENCE TO RELATED APPLICATIONS

This application is the National Stage of PCT/CN2019/102293 filed on Aug. 23, 2019, the disclosure of which is incorporated by reference.

TECHNICAL FIELD

Embodiments of the present disclosure relate to a display device, a manufacturing method of the display device, and a driving substrate.

BACKGROUND

With increasing progress of a Virtual Reality (VR) technology and an Augmented Reality (AR) technology, a display device suitable for VR/AR field is also developing towards directions of miniaturization, high Pixel Per Inch (PPI), a fast response and high color gamut. A silicon-based micro-display Organic Light-Emitting Device (OLED) panel is one of prominent directions. Although a silicon-based micro-display OLED starts relatively late, it is also becoming a new spotlight in display field with advantages of miniaturization and high PPI.

SUMMARY

Embodiments of the present disclosure relate to a display device, a manufacturing method of the display device, and a driving substrate. According to first aspect of the disclosure, it is provided a display device, comprising:
  a base substrate;
  an active area, the active area comprising a plurality of sub-pixels on the base substrate, and each of the plurality of sub-pixels comprising:
    a first reflecting electrode;
    a light-emitting element on the first reflecting electrode, the light-emitting element comprising a first electrode layer, an organic light-emitting functional layer and a second electrode layer stacked on the first reflecting electrode in sequence, the first electrode layer being a transparent electrode layer, and the organic light-emitting functional layer comprising an electron injection layer, an electron transport layer, a light emission layer, a hole injection layer and a hole transport layer;
    an insulating layer between the first reflecting electrode and the first electrode layer, the insulating layer being of light transmitted, such that light emitted from the organic light-emitting functional layer passes through the insulating layer and arrives at the first reflecting electrode so as to be reflected by the first reflecting electrode;
    a pixel circuit on the base substrate, the pixel circuit comprising a driving transistor, the driving transistor comprising a semiconductor layer, a source electrode and a drain electrode, one of the source electrode and the drain electrode being electrically connected with the first reflecting electrode, and the semiconductor layer being in the base substrate; and
    a storing capacitor on the base substrate, the storing capacitor being configured to store a data signal;
  an edge area surrounding the active area, the edge area comprising:
    a plurality of second reflecting electrodes on the base substrate; and
    a light shielding layer on one side of the plurality of second reflecting electrodes away from the base substrate.

According to second aspect of the disclosure it is provided a manufacturing method for a display device, the display device comprising an active area and an edge area surrounding the active area, and the manufacturing method comprising:
  providing a base substrate;
  forming a plurality of sub-pixels on the base substrate, the plurality of sub-pixels being in the active area, and the forming the plurality of the sub-pixels comprising:
    forming a first reflecting electrode;
    forming a light-emitting element on the first reflecting electrode, the light-emitting element comprising a first electrode layer, an organic light-emitting functional layer and a second electrode layer that are stacked on the first reflecting electrode in sequence, and the first electrode layer being a transparent electrode layer, and the organic light-emitting functional layer comprising an electron injection layer, an electron transport layer, a light emission layer, a hole injection layer and a hole transport layer;
    forming an insulating layer between the first reflecting electrode and the first electrode layer, the insulating layer being of light transmitted, such that light emitted from the organic light-emitting functional layer passes through the insulating layer and arrives at the first reflecting electrode so as to be reflected by the first reflecting electrode;
    forming a pixel circuit on the base substrate, the pixel circuit comprising a driving transistor, the driving transistor comprising a semiconductor layer, a source electrode and a drain electrode, one of the source electrode and the drain electrode being electrically connected with the first reflecting electrode, and the semiconductor layer being located in the base substrate; and
    forming a storing capacitor on the base substrate, the storing capacitor being configured to store a data signal;
  forming a plurality of second reflecting electrodes in the edge area; and
  forming a light shielding layer on one side of the plurality of reflecting electrodes away from the base substrate.

According to third aspect of the disclosure, it is provided a driving substrate suitable for driving a light-emitting element to emit light, the driving substrate comprising:
  a base substrate,
  an active area, the active area comprising a plurality of sub-pixels on the base substrate, and each of the plurality of sub-pixels comprising:
    a first reflecting electrode on the base substrate;
    an insulating layer on one side of the first reflecting electrode away from the base substrate, the insulating layer having a first surface suitable for forming the light-emitting element, the insulating layer being of light transmitted, such that the light emitted from the organic light-emitting functional layer passes through the insulating layer and arrives at the first reflecting electrode to be reflected by the first reflecting electrode;
    a pixel circuit on the base substrate, the pixel circuit comprising a driving transistor, the driving transistor comprising a semiconductor layer, a source electrode and a drain electrode, one of the source electrode and the drain electrode being electrically connected with the first reflecting electrode, and the semiconductor layer being located in the base substrate; and
    a storing capacitor on the base substrate, the storing capacitor being configured to store a data signal;

an edge area surrounding the active area, the edge area comprising:

a plurality of second reflecting electrodes on the base substrate; and a light shielding layer on one side of the plurality of second reflecting electrodes away from the base substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
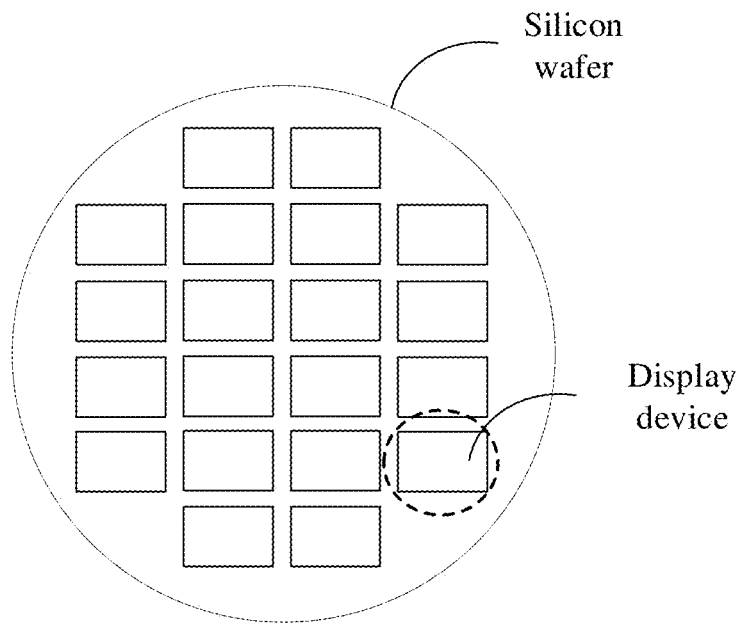
FIG. 1(a) is a schematic diagram of a display device arranged on a silicon wafer and provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Generally, an Organic Light-Emitting Device (OLED) is categorized into a bottom-emission type, a top-emission type, and a double-sided-emission type. A light-emitting element of the OLED generally includes a cathode, an anode and an organic light-emitting functional layer provided between the cathode and the anode. When the cathode is made from a transparent or semi-transparent conductive material, and the anode is made from a reflective metal, the OLED is the top-emission type device, and a substrate may be a transparent, semi-transparent or non-transparent substrate.

A micro-OLED belongs to a silicon-based display. Due to an excellent electrical characteristic and an extremely fine device size, a silicon-based device is conducive to realizing high integration. Generally, during a manufacturing process of a silicon-based micro-OLED, an anode including reflective metals is manufactured by a panel factory, while other portion located below the reflective metal is manufactured by a wafer factory. However, it is very difficult for the panel factory to accurately control a pattern of the reflective metal by an etching process while the reflective metal is being manufactured, which not only increases manufacturing cost and difficulty of the silicon-based micro-OLED, but also influences emergent light brightness.

An embodiment of the present disclosure provides a display device, comprising a base substrate, an active area and an edge area surrounding the active area. Herein, the active area includes: a plurality of sub-pixels located on the base substrate, each sub-pixel including: a first reflecting electrode; a light-emitting element located on the first reflecting electrode, the light-emitting element including a first electrode layer, an organic light-emitting functional layer and a second electrode layer that are stacked on the first reflecting electrode in sequence, the first electrode layer being a transparent electrode layer, and the organic light-emitting functional layer including an electron injection layer, an electron transport layer, a light emission layer, a hole injection layer and a hole transport layer. The each sub-pixel further includes: an insulating layer located between the first reflecting electrode and the first electrode layer, the insulating layer is of light transmitted, such that the light emitted from the organic light-emitting functional layer passes through the insulating layer and arrives at the first reflecting electrode so as to be reflected by the first reflecting electrode. The each sub-pixel further includes a pixel circuit, the pixel circuit is located on the base substrate and includes a driving transistor, the driving transistor including a semiconductor layer, a source electrode and a drain electrode, one of the source electrode and the drain electrode is electrically connected with the first reflecting electrode, and the semiconductor layer being located in the base substrate. The each sub-pixel further includes a storing capacitor located on the base substrate, the storing capacitor being configured to store a data signal. In the embodiment, the edge area includes: a plurality of second reflecting electrodes located on the base substrate; and a light shielding layer provided on a side of the plurality of second reflecting electrodes away from the base substrate.

In the display device of the embodiment, the insulating layer is utilized to separate the first reflecting electrode and the first electrode layer from each other. In this way, it is possible to integrate the first reflecting electrode into the driving substrate manufactured by the wafer factory, which not only reduces the manufacturing cost and difficulty of the first reflecting electrode, but also guarantees high emergent light brightness and high light output efficiency of the display device. Herein, the "driving substrate" refers to a stacked structure below the first electrode layer (excluding the first electrode layer) in the display device; and because the stacked structure includes the pixel circuit including the driving transistor, the stacked structure is suitable for driving the light-emitting element to emit light.

Figure 1B:
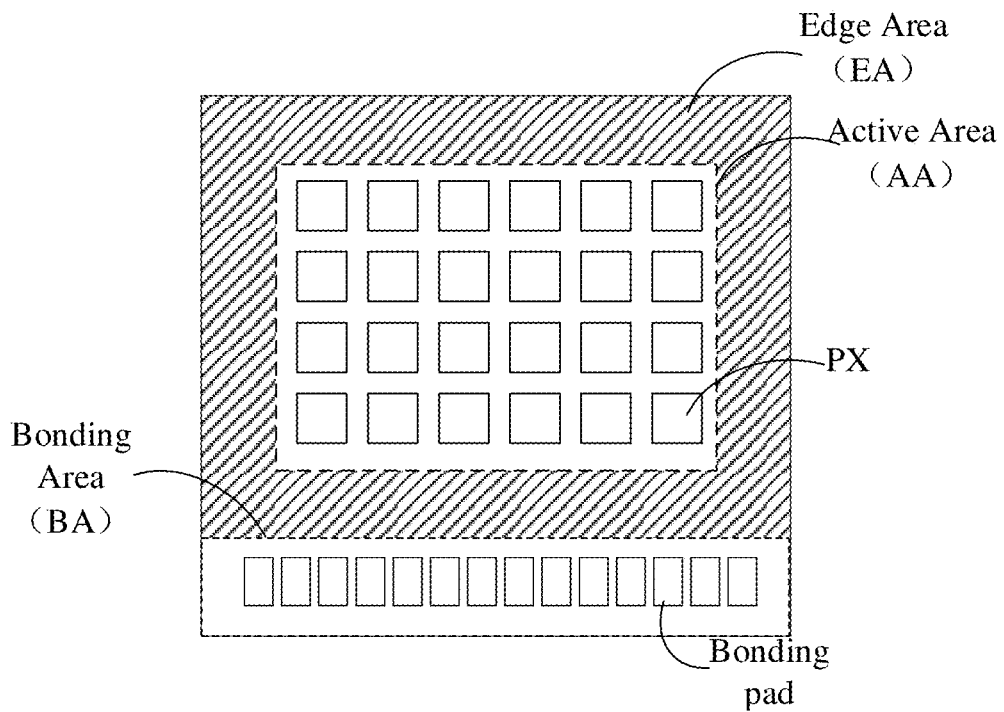
FIG. 1(b) is a schematic diagram of respective functional areas of a display device provided by an embodiment of the present disclosure.
Figure 7:
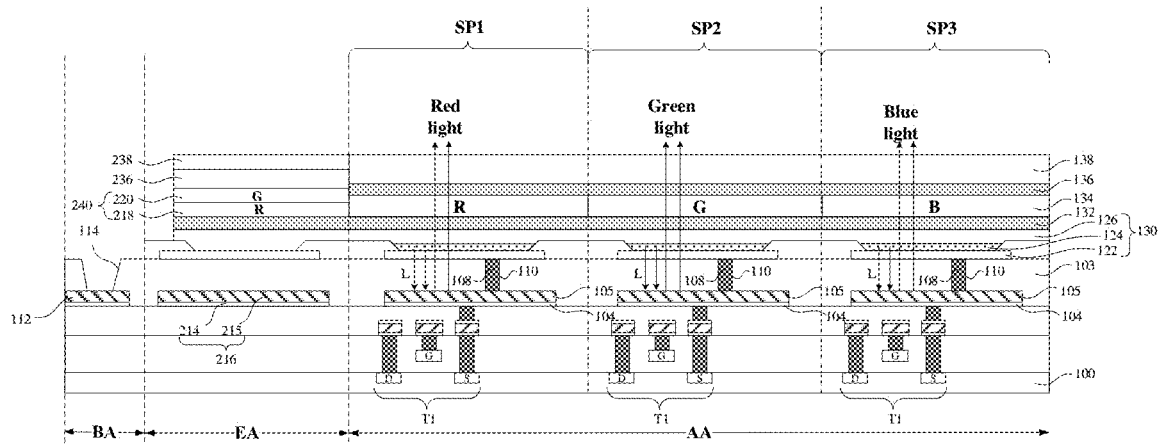
FIG. 7 is a cross-sectional schematic diagram of a display device provided by an embodiment of the present disclosure.

FIG. 1(a) is a schematic diagram of a display device arranged on a silicon wafer and provided by an embodiment of the present disclosure, namely a wafer map. The wafer map schematically illustrates the number and an arrangement manner of the display devices on the silicon wafer. It can be understood that, the number and the arrangement manner of the display devices illustrated in the diagram are only for schematic purposes, and are not intended to limit the embodiment of the present disclosure. FIG. 1(b) is a schematic diagram of respective functional areas of a display device provided by an embodiment of the present disclosure. As illustrated in FIG. 1(b), the display device comprises an active area (AA for short), an edge area (EA for short) surrounding the active area and a bonding area (BA for short). The active area AA includes a plurality of pixel units PX arranged in an array. Each pixel unit PX includes a plurality of sub-pixels SP. For example, a pixel unit may include 3, 4, 5 or more sub-pixels, which needs to be designed and determined according to a practical application environment, and is not limited herein. As illustrated in FIG. 1(b), the display device further comprises a plurality of bonding pads located in the bonding area BA, the bonding pads being used for providing a channel for signal input or output for the display device. FIG. 7 is a cross-sectional schematic diagram of a display device provided by an embodiment of the present disclosure. For example, as illustrated in FIG. 7, the display device comprises three sub-pixels, namely a red sub-pixel SP1, a green sub-pixel SP2 and a blue sub-pixel SP3. Colors of the sub-pixels in the display device are only illustrative, and may also include other colors, such as blue, white, etc.

Figure 2:
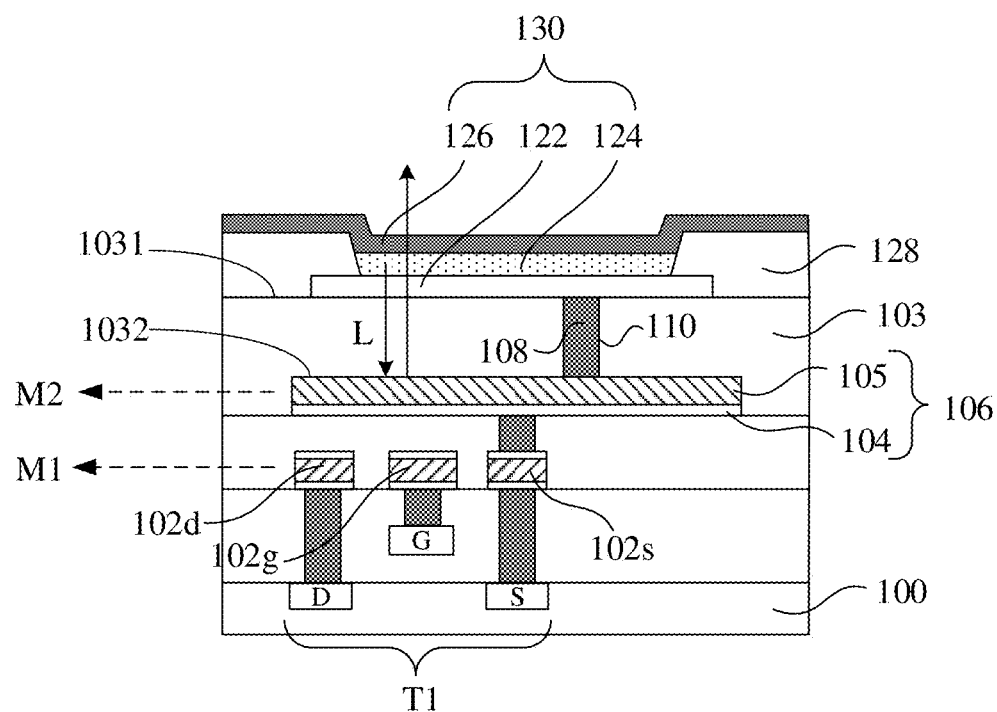
FIG. 2 is a partially enlarged cross-sectional schematic diagram of a sub-pixel of a display device provided by an embodiment of the present disclosure.

FIG. 2 is a partially enlarged cross-sectional schematic diagram of a sub-pixel of a display device provided by an embodiment of the present disclosure. As illustrated in FIG. 2 and FIG. 7, for example, each sub-pixel includes a first reflecting electrode 106 and a light-emitting element 130 located on the first reflecting electrode 106. The light-emitting element 130 includes a first electrode layer 122, an organic light-emitting functional layer 124 and a second electrode layer 126 that are stacked on a first reflecting electrode 106 in sequence.

For example, continually with reference to FIG. 2 and FIG. 7, each sub-pixel further includes an insulating layer 103 located between the first reflecting electrode 106 and the first electrode layer 122, the insulating layer 103 is of light transmitted, such that the light emitted from the organic light-emitting functional layer 124 passes through the insulating layer and arrives at the first reflecting electrode 106 so as to be reflected by the first reflecting electrode 106. The insulating layer 103 is utilized to separate the first reflecting electrode 106 from the first electrode layer 122. Thus, when being manufactured, the first reflecting electrode 106 can be integrated into a driving substrate manufactured by a wafer factory, which reduces the cost and difficulty of manufacturing the first reflecting electrode 106. Moreover, when the light L emitted from the organic light-emitting functional layer 124 is incident on a first surface 1031 of the insulating layer 103 adjacent to the organic light-emitting functional layer 124, because the insulating layer 103 has a light-transmitting property, the light L can penetrate through the first surface 1031 of the insulating layer 103, and exits from a second surface 1032 of the insulating layer 103 adjacent to the first reflecting electrode 106 and arrives at the first reflecting electrode 106. The first reflecting electrode 106 has a light reflecting property, so it reflects the light L incident thereon back to the light-emitting element 130, and finally, the light L exits from the light-emitting element 130. In the embodiment, due to the light-transmitting property of the insulating layer 103, light reflected by the first reflecting electrode 106 exits outward with almost no loss, and therefore ensuring high emergent light brightness and high light output efficiency of the display device. For example, insulating layers 103 in three sub-pixels are integrally formed so as to facilitate manufacturing, and to reduce difficulty of a manufacturing process.

In at least some embodiments, a conductive path used for electrically connecting a first electrode layer with a first reflecting electrode is provided in an insulating layer. Two examples of the conductive path are provided below.

For example, as illustrated in FIG. 2, the insulating layer 103 includes a via 110 filled with a metallic element 108, and the first reflecting electrode 106 is electrically connected with the first electrode layer 122 through the metallic element 108. Thus, forming a conductive path between the first reflecting electrode 106 and the first electrode layer 122 in the insulating layer 103 is conducive to transmitting a signal supplied by a pixel circuit in the display device to the first electrode layer 122 through the first reflecting electrode 106, thus not only facilitating control of the pixel circuit over the light-emitting element, but also making the display device more compact, which facilitates miniaturization of a device. Further, for example, the metallic element 108 is made of a metal material, such as a tungsten (W) metal, and a via filled with the W metal is also called a W-via. For example, in a situation that a thickness of the insulating layer 103 is relatively large, forming the W-via in the insulating layer 103 can guarantee stability of the conductive path; moreover, because a process for manufacturing the W-via is well-developed, the obtained insulating layer 103 has good surface flatness, which is conducive to reducing contact resistance between the insulating layer 103 and the first electrode layer 122. It can be understood that, the W-via is suitable for realizing not only the electrical connection between the insulating layer 103 and the first electrode layer 122, but also the electrical connection between the first reflecting electrode 106 and the pixel circuit, or other electrical connections between other wiring layers. The electrical connection between the first reflecting electrode 106 and the pixel circuit will be described in detail later.

Figure 3:
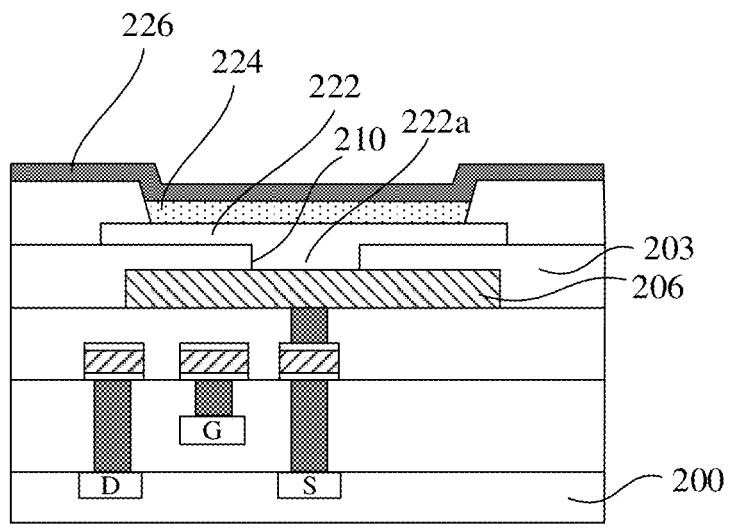
FIG. 3 is a partially enlarged cross-sectional schematic diagram of a sub-pixel of a display device provided by another embodiment of the present disclosure.

For another example, as illustrated in FIG. 3, an insulating layer 203 includes a first opening 210 exposing a first reflecting electrode 206, and at least one portion 222a of a first electrode layer 222 is located in the first opening 210 and is electrically connected with the first reflecting electrode 206. In FIG. 2, the first electrode layer 122 is electrically connected with the first reflecting electrode 106 through the metallic element 108, and the first electrode layer 122 is not in direct contact with the first reflecting electrode 106. In FIG. 3, the portion 222a of the first electrode layer 222 fills in the first opening 210 of the insulating layer 203, and is in direct contact with the first reflecting electrode 206 to form electrical connection. Compared with FIG. 2, the need for a metallic element filling in the first opening 210 of the insulating layer 203 in FIG. 3 is eliminated, so that a manufacturing process is simpler. Moreover, because the first electrode layer 222 and the first reflecting electrode 206 are in direct contact with each other, a thickness of a display device is reduced, which is beneficial to thinning the display device.

Figure 4:
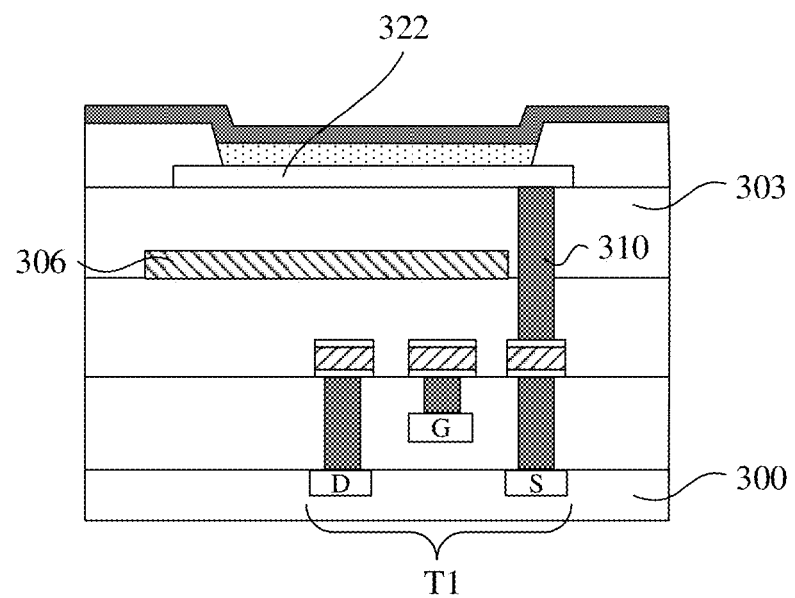
FIG. 4 is a partially enlarged cross-sectional schematic diagram of a sub-pixel of a display device provided by yet another embodiment of the present disclosure.

In at least some embodiments, a first reflecting electrode and a first electrode layer are insulated from each other. For example, as illustrated in FIG. 4, an entire first reflecting electrode 306 is separated from a first electrode layer 322 by an insulating layer 303 and is insulated from the first electrode layer 322. That is, there is no electrical connection between the first electrode layer 322 and the first reflecting electrode 306. In this way, the first reflecting electrode 306 can be manufactured without changing a positional relationship or connection relationship between a wiring layer and a pixel circuit in an existing display device, purposes of the present disclosure can be achieved as well. In such case, the pixel circuit including a driving transistor T1 is electrically connected with the first electrode layer 322 through a via 310, so to control light emission of a light-emitting element.

For example, as illustrated in FIG. 2, the display device further comprises at least one wiring layer M1, and the at least one wiring layer M1 is located between the first reflecting electrode 106 and a base substrate 100. For example, the wiring layer M1 includes a metallic layer (a shadow portion); a gate electrode connecting portion 102g, a source electrode connecting portion 102s and a drain electrode connecting portion 102d are located in the same metallic layer.

For example, as illustrated in FIG. 2, the first reflecting electrode 106 includes a metallic layer 105, and a material of the metallic layer 105 is, for example, aluminum, an aluminum alloy, or an aluminum-copper alloy. Because the aluminum or the aluminum-copper alloy has small resistance and high reflectivity, emergent light brightness and light output efficiency of the display device can be increased. For example, a thickness of the metallic layer 105 is ranged from 10 nm to 1000 nm. If the thickness is relatively lower, a reflection effect is not obvious; if the thickness is relatively larger, an overall thickness of a panel is relatively large. The first reflecting electrode 106 can be regarded as a wiring layer M2 of the display device. As illustrated in FIG. 2, when the display device comprises a plurality of wiring layers, the wiring layer M2 where the first reflecting electrode 106 is located is an uppermost wiring layer, and thus, manufacturing of the first reflecting electrode 106 can be simplified, because architecture of a bottom layer of the display device cannot be destroyed.

For example, as illustrated in FIG. 2, the first reflecting electrode 106 further includes at least one protective layer 104, the protective layer 104 and the metallic layer 105 are stacked and the protective layer 104 is located on one side of the metallic layer 105 adjacent to the base substrate 100. That is, the protective layer 104 is located on a surface of the metallic layer 105 adjacent to the base substrate 100. Thus, the protective layer 104 can prevent the metallic layer 105 from being oxidized. For example, a material of the protective layer is an electrically conductive material, such as TiN. Because a surface of the metallic layer 105 adjacent to the first electrode layer 122 is not provided with the protective layer 104, light emitted from the organic light-emitting functional layer 124 and passing through the first electrode layer 122 and the insulating layer 103 can be directly incident on a surface of the metallic layer 105, thereby reducing a light loss at an interface, and increasing the light reflection efficiency and the emergent light brightness of the display device.

Figure 5:
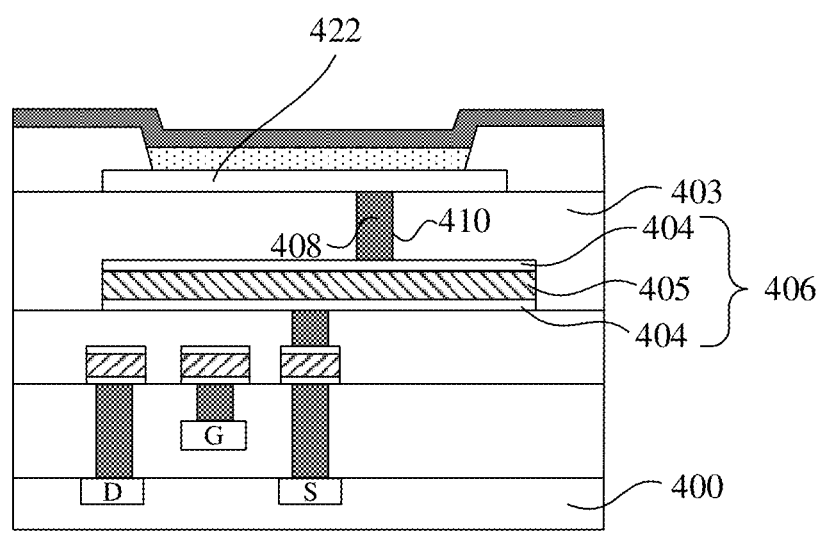
FIG. 5 is a partially enlarged cross-sectional schematic diagram of a sub-pixel of a display device provided by still another embodiment of the present disclosure.

In an embodiment of the present disclosure, an arrangement manner and the number of protective layers 104 are not limited to a case illustrated by FIG. 2. The first reflecting electrode may not be provided with the protective layer. For example, as illustrated in FIG. 3 and FIG. 4, each of the first reflecting electrode 106 and the first reflecting electrode 306 does not include any protective layer, but only includes a metallic layer. In a situation that only one protective layer is provided, the protective layer may be provided on a single side of the metallic layer. For example, the protective layer is only provided on one side of the metallic layer 105 adjacent to the base substrate 100 (as illustrated in FIG. 2), alternatively, the protective layer is provided on one side of the metallic layer 105 away from the base substrate 100 (not illustrated). In a situation that two protective layers are provided, the two protective layers may be provided on two sides of the metallic layer. For example, as illustrated in FIG. 5, a first reflecting electrode 406 includes two protective layers 404 and a metallic layer 405 between the two protective layers 404. The two protective layers 404 are respectively located on one side of the metallic layer 405 adjacent to a base substrate 400 and one side of the metallic layer 405 away from the base substrate 400. In such case, an insulating layer 403 includes a via 410 and a metallic element 408 in the via 410. The first reflecting electrode 406 including the two protective layers 404 and the metallic layer 405A is electrically connected with the first electrode layer 422 through the metallic element 408. It can be understood that, the above-mentioned protective layer may also be applied to other wiring layers. For example, as illustrated in FIG. 2, an upper side and a lower side of each of the gate electrode connecting portion 102g, the source electrode connecting portion 102s, and the drain electrode connecting portion 102d are each provided with a protective layer, thus effectively preventing these electrode connecting portions from being oxidized, and increasing electrical conductivity property.

For example, as illustrated in FIG. 7, an insulating layer 103 further includes a second opening 114 that exposes a bonding pad 112. The second opening 114 is provided to facilitate electrical connection and signal communication between the bonding pad 112 and an external circuit. The display device in FIG. 7 adopts a sub-pixel structure illustrated in FIG. 2. It can be understood that, sub-pixel structures illustrated by any one of FIGS. 3 to 5 may also be applied to the display device illustrated by FIG. 7, which will not be repeated here.

Figure 6A:
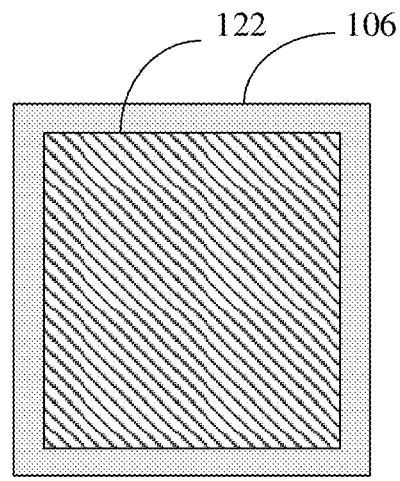
FIG. 6(a) and FIG. 6(b) respectively illustrate two different positional relationships between a first electrode layer and a first reflecting electrode provided by an embodiment of the present disclosure.

In at least some embodiments, a relative positional relationship between a first electrode layer and a first reflecting electrode may be determined according to actual needs. For example, as illustrated in FIG. 2 and FIG. 6(a), an orthographic projection of the first electrode layer 122 on a plane where the base substrate 100 is located is within an orthographic projection of the first reflecting electrode 106 on the plane where the base substrate 100 is located. That is, an area of the orthographic projection of the first electrode layer 122 is smaller than an area of the orthographic projection of the first reflecting electrode 106. Thus, lights passing through the first electrode layer 122 are substantially all incident on the first reflecting electrode 106 and reflected by the first reflecting electrode 106, thereby increasing the light output efficiency and the emergent light brightness of the display device. It can be understood that, an arrangement manner of the first electrode layer and the first reflecting electrode is not limited to cases illustrated by FIG. 2 and FIG. 6(a), and vice versa. For example, as illustrated in FIG. 3, an orthographic projection of the first reflecting electrode 206 on a plane where the base substrate 200 is located is within an orthographic projection of the first electrode layer 222 on the plane where the base substrate 200 is located. For another example, as illustrated in FIG. 4 and FIG. 6(b), an orthographic projection of the first reflecting electrode 306 on a plane where a base substrate 300 is located is partially overlapped with an orthographic projection of a first electrode layer 322 on the plane where the base substrate 300 is located; because such a positional relationship doesn't change an electrical connection relationship between a wiring layer and a driving transistor in an existing display device, a manufacturing process for the first reflecting electrode 306 becomes simple.

Figure 6B:
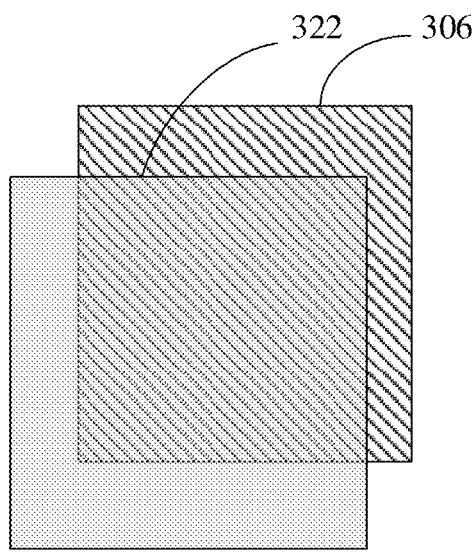
Figure 9A:
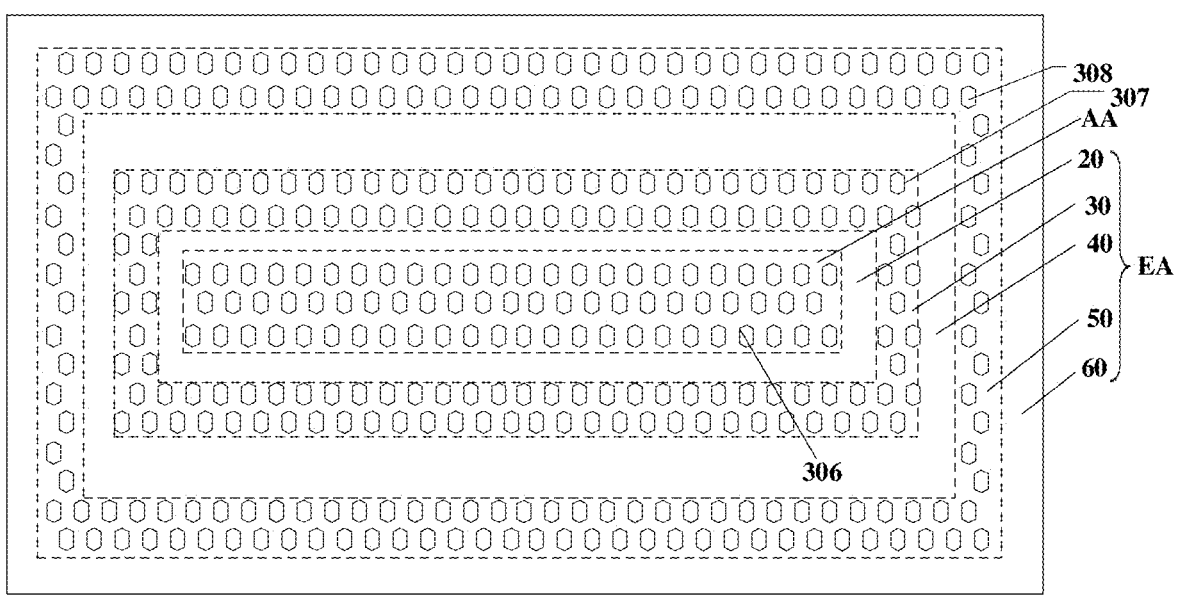
FIG. 9(a) is a structural schematic diagram of a display device provided by an embodiment of the present disclosure.

In at least some embodiments, a shape of a first reflecting electrode is not limited to a rectangle illustrated in FIG. 6(a) and FIG. 6(b), and may be in other regular shapes, such as a circle, an ellipse, a parallelogram, a regular polygon, a trapezoid, etc. Alternatively, the first reflecting electrode may further have irregular shapes, such as a zigzag shape, a curved shape, a honeycomb shape and the like. For example, a first reflecting electrode 306 in FIG. 9(a) is in a honeycomb shape. In a plane parallel to a base substrate, a shape of the first electrode layer may be identical with or different from that of the first reflecting electrode. For example, as illustrated in FIG. 6(a), in a plane parallel to the base substrate 100, a shape of the first reflecting electrode 106 is identical with that of the first electrode layer 122. Thus, light reflection of the first reflecting electrode 106 can guarantee that brightness of emergent light is more uniform. For another example, the first electrode layer has a circular shape, and the first reflecting electrode has a rectangular shape. Further, in such case, an orthographic projection of the circular first electrode layer in the plane where the base substrate is located is located within an orthographic projection of the rectangular first reflecting electrode in the plane where the base substrate is located. In this way, light passing through the circular first electrode layer is substantially all incident on the rectangular first reflecting electrode and is reflected by the rectangular first reflecting electrode, thereby increasing the light output efficiency and the emergent light brightness of a display device.

Figure 18:
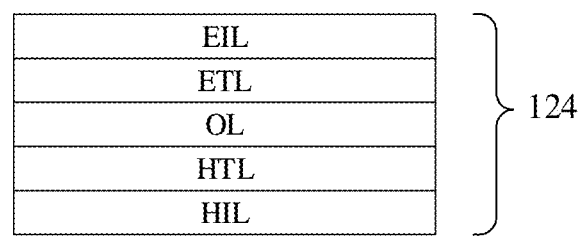
FIG. 18 is a structural schematic diagram of an organic light-emitting functional layer of a display device provided by an embodiment of the present disclosure.

In at least some embodiments, an organic light-emitting functional layer may include a light emission layer and includes a multi-layer structure includes one or more film layers of a hole injection layer, an electron injection layer, a hole transport layer, an electron transport layer, an electron blocking layer, and a hole blocking layer. FIG. 18 is a structural schematic diagram of an organic light-emitting functional layer provided by an embodiment of the present disclosure. For example, as illustrated in FIG. 18, the organic light-emitting functional layer 124 includes an electron injection layer EIL, an electron transport layer ETL, a light emission layer OL, a hole transport layer HTL, and a hole injection layer HIL from top to bottom in sequence, and these layers may employ known materials and structures in the art, which will not be discussed in detail here. The organic light-emitting functional layer 124 may comprise an organic material. As illustrated in FIG. 2, according to a required gray scale, light can be emitted by the organic material due to a luminescence property of the organic material under voltage driving of the first electrode layer 122 and the second electrode layer 126.

Figure 8A:
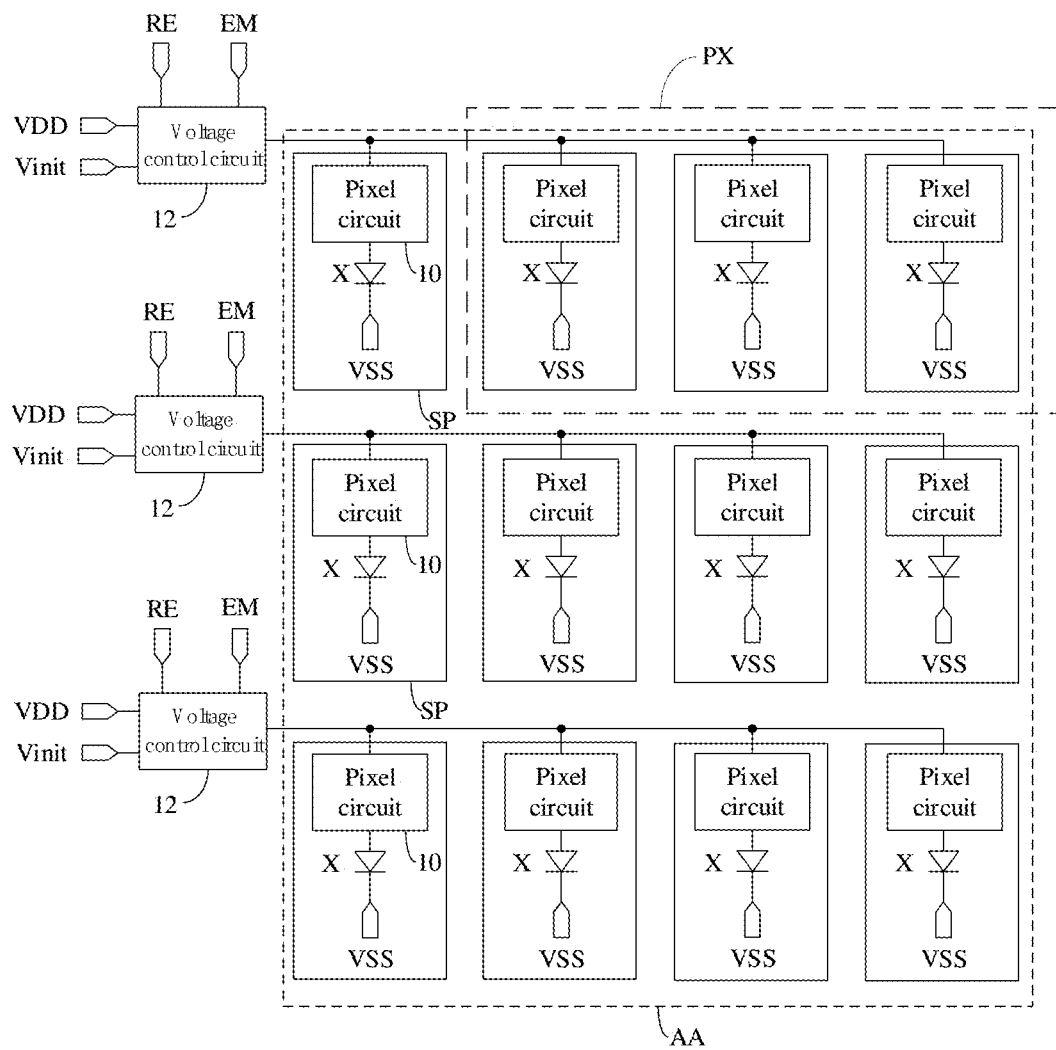
FIG. 8(a) is a circuit schematic diagram of a display device provided by an embodiment of the present disclosure.
Figure 8B:
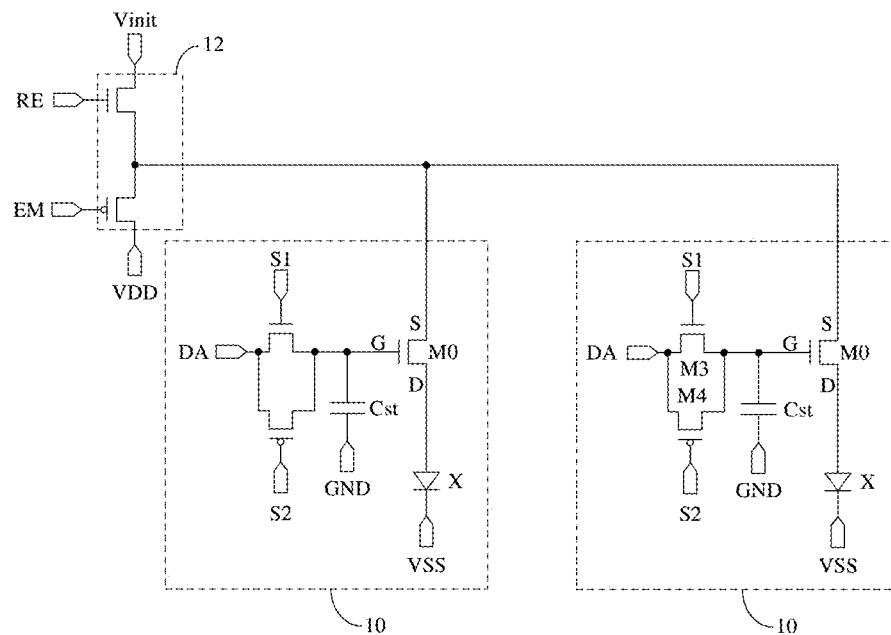
FIG. 8(b) is a partial circuit schematic diagram of a display device provided by an embodiment of the present disclosure.

In at least some embodiments, each sub-pixel further includes a pixel circuit, the pixel circuit including a driving transistor. FIG. 8(a) is a circuit schematic diagram of a display device provided by an embodiment of the present disclosure. FIG. 8(b) is a partial circuit schematic diagram of a display device provided by an embodiment of the present disclosure. For example, as illustrated in FIG. 8(a), in an active area AA, each sub-pixel SP includes a light-emitting element X and a pixel circuit 10 coupled with the light-emitting element X. As illustrated in FIG. 8(b), each pixel circuit 10 includes a driving transistor M0. The light-emitting element X includes, for example, an OLED. Thus, an anode of the OLED is electrically connected with a second terminal D of the driving transistor M0, and a cathode of the OLED is electrically connected with a second power supply terminal VSS. A voltage of the second power supply terminal VSS is generally a negative voltage or a ground voltage VGND (for example, 0V). The driving transistor M0 may be an N-type transistor, and when current flows from its first terminal S to its second terminal D, the first terminal S may be used as its source electrode, and the second terminal D as its drain electrode. When the current flows from its second terminal D to its first terminal S, the second terminal D may be used as its source electrode, and the first terminal S as its drain electrode.

For example, as illustrated in FIG. 2 and FIG. 7, a driving transistor T1 in each sub-pixel includes a source electrode S, a drain electrode D and a semiconductor layer (a portion located between the source electrode S and the drain electrode D), and one of the source electrode S and the drain electrode D is electrically connected with the first reflecting electrode 106. The semiconductor layer is located in the base substrate, and the semiconductor layer is, for example, a channel area formed between the source electrode S and the drain electrode D. For example, as illustrated in FIG. 2, the driving transistor T1 includes a gate electrode G, a source electrode S and a drain electrode D. The three electrodes respectively correspond to three electrode connecting portions. For example, the gate electrode G is electrically connected with the gate electrode connecting portion 102g, the source electrode S is electrically connected with the source electrode connecting portion 102s, and the drain electrode D is electrically connected with the drain electrode connecting portion 102d. The source electrode S of the driving transistor T1 is electrically connected with the first reflecting electrode 106 through the source electrode connecting portion 102s. When the driving transistor T1 is switched on, an electrical signal VDD provided by a power line may be transmitted to the first electrode layer 122 through the drain electrode S of the driving transistor T1, the drain electrode connecting portion 102d and the first reflecting electrode 106. Because a voltage difference is formed between the second electrode layer 126 and the first electrode layer 122, an electric field is formed therebetween, and the organic light-emitting functional layer 124 emits light under the action of the electric field.

In at least some embodiments, each sub-pixel further includes a storing capacitor located on a base substrate. For example, as illustrated in FIG. 8(b), each sub-pixel further includes a storing capacitor Cst located on a base substrate, and the storing capacitor Cst is configured to store a data signal. A first terminal of the storing capacitor Cst is coupled with a gate electrode G of the driving transistor M0, and a second terminal of the storing capacitor Cst is coupled with a grounding terminal GND. Thus, the gate electrode G of the driving transistor T1 can store a data signal of a high gray scale or low gray scale in the storing capacitor Cst.

In at least some embodiments, an edge area includes a plurality of second reflecting electrodes located on a base substrate and a light shielding layer provided on one side of the plurality of second reflecting electrodes away from the base substrate. For example, as illustrated in FIG. 7, a second reflecting electrode 216 is provided in an edge area EA. The second reflecting electrode 216 has a configuration same as that of the first reflecting electrode 106; for example, the second reflecting electrode 216 includes a metallic layer 215 and a protective layer 214. For example, the metallic layer 215 and metallic layers 105 are arranged in a same layer, while the protective layer 214 and protective layers 104 are arranged in a same layer, which are beneficial to simplifying a manufacturing process. A light shielding layer 240 is provided on one side of the second reflecting electrode 216 away from a base substrate 100, and the light shielding layer 240 is used for blocking light rays reflected by the second reflecting electrode 216 and reducing light leakage to the edge area from an active area. For example, the light shielding layer 240 includes a stacked structure of color film layers of at least two colors. For example, the light shielding layer 240 includes a red color film layer 218 and a green color film layer 220 that are stacked with each other. In other embodiments, a stacked structure of color film layers of three colors may also be employed. For another example, the light shielding layer includes a black matrix layer, and the black matrix layer is made of a black resin material, which can also achieve a light shielding effect as well. When being manufactured, the color film layers in the light shielding layer can be manufactured simultaneously with color film layers of a same color in the active area AA in a same process step, and thus, steps of a manufacturing process can be reduced.

For example, as illustrated in FIG. 7, the display device further includes a first encapsulation layer 132, a color filter layer 134, a second encapsulation layer 136 and an overcoat layer 138, all of which are provided in the active area AA. For example, the first encapsulation layer 132 is located on one side of the second electrode layer 126 away from the base substrate. The color filter layer 134 is located on one side of the first encapsulation layer 132 away from the base substrate, and includes a red color film layer R, a green color film layer G and a blue color film layer B. The second encapsulation layer 136 and the overcoat layer 138 are located on one side of the color filtering layer 134 away from the base substrate. For materials of the first encapsulation layer 132, the color filtering layer 134, the second encapsulation layer 136 and the overcoat layer 138, conventional materials in the art can be employed, which will not be discussed in detail here. For example, an encapsulation layer 236 and an overcoat layer 238 that cover the light shielding layer 240 are provided in the edge area EA. For example, the encapsulation layer 236 and the second encapsulation layer 136 are made of a same material and manufactured in a same process step, while the overcoat layer 238 and the overcoat layer 138 are made of a same material and manufactured in a same process step, and thus, steps of a manufacturing process can be reduced.

Figure 9B:
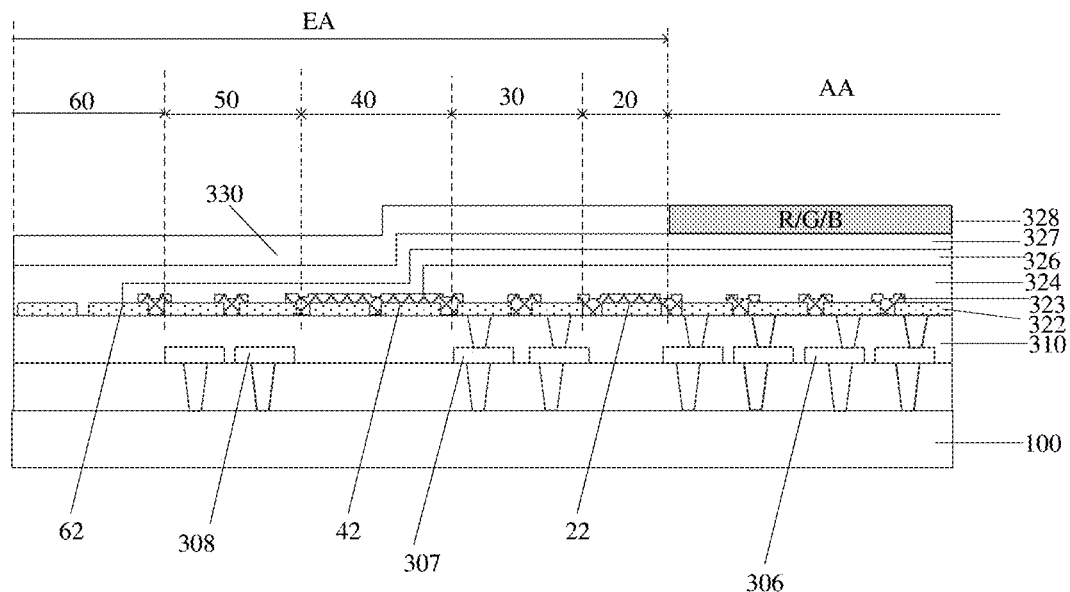
FIG. 9(b) is a cross-sectional schematic diagram of a display device provided by an embodiment of the present disclosure.

FIG. 9(a) is a structural schematic diagram of a display device provided by an embodiment of the present disclosure. FIG. 9(b) is a cross-sectional schematic diagram of a display device provided by an embodiment of the present disclosure. For example, as illustrated in FIG. 9(a) and FIG. 9(b), the display device includes: a first reflecting electrode pattern located in an active area AA. The first reflecting electrode pattern includes a plurality of first reflecting electrodes 306 spaced apart from one another. For example, an edge area EA includes a sensing area 30, and the display device further comprises a second reflecting electrode pattern located in the sensing area 30, and the second reflecting electrode pattern includes a plurality of second reflecting electrodes 307 spaced apart from one another.

In at least some embodiments, an edge area further includes a plurality of third reflecting electrodes located on a base substrate. For example, as illustrated in FIG. 9(a) and FIG. 9(b), the edge area EA further includes a connecting electrode area 50, and the display device further comprises a third reflecting electrode pattern located in the connecting electrode area 50, and the third reflecting electrode pattern includes a plurality of third reflecting electrodes 308 spaced apart from each other.

In at least some embodiments, pattern density of a first reflecting electrode pattern is equal to the pattern density of a second reflecting electrode pattern and/or the pattern density of a third reflecting electrode pattern. As illustrated in FIG. 9(a), the pattern density of the plurality of first reflecting electrodes 306 is equal to that of the plurality of second reflecting electrodes 307, or, the pattern density of the plurality of first reflecting electrodes 306 is equal to that of the plurality of third reflecting electrodes 308, or, the pattern density of the plurality of first reflecting electrodes 306, the pattern density of the plurality of second reflecting electrodes 307 and the pattern density of the plurality of third reflecting electrodes 308 are equal to one another. In this way, over-etching can be avoided when an electrically conductive layer is etched. Inventors founds that, during etching process, the electrically conductive layer in an active area of a display device is etched to form the reflecting electrode pattern, while the electrically conductive layer in an edge area of the organic light-emitting diode display device is completely or partially etched, thus, the pattern density of the active area is different from that of the edge area, and in turns a difference between the amount of an electrically conductive material etched off in the active area and the amount of an electrically conductive material etched off in the edge area is quite different in a unit area in case of a dry-etching process is performed. Because selectivity of the dry-etching process is poor, on one hand, a film thickness and size uniformity of the obtained first electrode pattern are difficult to control, on the other hand, an insulating layer under the first electrode pattern is likely to over etching. In the embodiment, at least one of the pattern density of the second reflecting electrode pattern and the pattern density of the third reflecting electrode pattern is equal to that of the first reflecting electrode pattern, which can avoid over etching and in turns to increase etching uniformity.

In at least some embodiments, the edge area further includes a light shielding layer provided on one side of a plurality of second reflecting electrodes and a plurality of third reflecting electrodes away from a base substrate. For example, as illustrated in FIGS. 9(a) and 9(b), a light shielding layer 330 is provided on one side of the plurality of second reflecting electrodes 307 and the plurality of third reflecting electrodes 308 away from a base substrate, the light shielding layer includes a black matrix layer, and the black matrix layer is made of black resin, which can shield light rays reflected by the second reflecting electrodes 307 and the third reflecting electrodes 308 and reduce light leakage to the edge area from an active area.

For example, as illustrated in FIG. 9(a) and FIG. 9(b), the edge area EA further includes a first dummy area 20 surrounding the active area AA, and no reflecting electrode is provided in the first dummy area 20. For example, the first dummy region 20 is provided with a first dummy electrode 22. For example, the first dummy electrode 22 in the first dummy area 20 and a plurality of first electrodes 322 in the active area AA are disposed in a same layer, to simplify a manufacturing process. In the active area AA, two adjacent first electrodes 322 are separated by a pixel defining layer 323. For example, an organic light-emitting functional layer 324, a second electrode 326, and an encapsulation layer 327 all extend into the first dummy area 20.

For example, as illustrated in FIG. 9(a) and FIG. 9(b), the edge area EA further includes a second dummy area 40 surrounding a sensing area 30, and no reflecting electrode is provided in the second dummy area 40. For example, the second dummy area 40 is provided with second dummy electrodes 42.

For example, as illustrated in FIG. 9(a) and FIG. 9(b), the edge area EA further includes a third dummy area 60 surrounding a connecting electrode area 50, and no reflecting electrode is provided in the third dummy area 60. For example, the third dummy area 60 is provided with third dummy electrodes 62.

In at least some embodiments, the edge area of the display device further includes a voltage control circuit. For example, as illustrated in FIG. 8(a) and FIG. 8(b), the display device may further comprise: a plurality of voltage control circuits 12 located in an edge area of an array substrate; first electrodes of driving transistors M0 in a pixel circuit 10 share and are coupled with the voltage control circuit 12. The voltage control circuit is configured to output an initialization signal Vinit to the first electrodes of the driving transistors M0 in response to a reset control signal RE, so as to reset corresponding light-emitting elements X; and the voltage control circuit is further configured to output a first power signal VDD to the first electrodes of the driving transistors in response to an emission control signal EM, so as to drive the light-emitting element X to emit light.

In at least some embodiments, a first electrode layer is a transparent electrode layer. For example, the first electrode layer may be made of a transparent material or a semi-transparent material. Similarly, a second electrode layer may also be a transparent electrode layer, and for example, the second electrode layer is made of the transparent material or the semi-transparent material. The transparent material is, for example, a transparent conductive oxide, including but not limited to indium tin oxide (ITO), indium zinc oxide (IZO), cadmium tin oxide (CTO), stannum dioxide ($SnO_2$) and zinc oxide (ZnO), etc. For example, the first electrode layer is made of the ITO. Because the ITO material has a high work function in comparison with common molybdenum and titanium metals, the ITO material is suitable for serving as an OLED anode material. Because the ITO has high light-transmissivity, light emitted from an organic light-emitting functional layer can pass through the first electrode layer with almost no loss, which further increases light output efficiency and emergent light brightness of the display device. In a silicon-based micro-OLED display device, one of the first electrode layer and the second electrode layer serves as an anode, and the other serves as a cathode.

In at least some embodiments, a material of an insulating layer is a transparent material, such as silicon nitride (SiNx), silicon oxide (SiOx), aluminum oxide ($Al_2O_3$), aluminum nitride (AlN), or other suitable materials. For example, the insulating layer may be a single layer, and may also be a multi-layer.

In at least some embodiments, a base substrate is a silicon-based substrate. The silicon-based substrate has a well-developed manufacturing process and a stable property, so that the silicon-based substrate is suitable for manufacturing a highly-integrated micro-display device. For example, the display device is a silicon-based micro-OLED display device.

In the display device of the embodiment, the first encapsulation layer 132, the color filter layer 134, the second encapsulation layer 136, the overcoat layer 138 and the light-emitting element including the first electrode layer 122, the organic light-emitting functional layer 124 and the second electrode layer 126 are all manufactured in the panel factory; moreover, the insulating layer 103 above a bonding pad 112 is etched in the panel factory, so as to expose the bonding pad. The exposed bonding pad is used for a Flexible Printed Circuit (FPC) board bonding or wire bonding. By employing the display device designed by the present disclosure, the first reflecting electrode 106 and the insulating layer 103 can be manufactured in the wafer factory, and thus a driving substrate suitable for forming the light-emitting element is fabricated in the wafer factory, which not only reduces the difficulty of manufacturing the first reflecting electrode, but also facilitates a subsequent process of the panel factory.

Another embodiment of the present disclosure provides a manufacturing method for a display device, the display device comprising an active area and an edge area surrounding the active area, and the manufacturing method comprising: providing a base substrate; forming a plurality of sub-pixels on the base substrate, the plurality of sub-pixels being located in the active area. Herein, the forming the sub-pixels includes: forming a first reflecting electrode; forming a light-emitting element on the first reflecting electrode, the light-emitting element including a first electrode layer, an organic light-emitting functional layer and a second electrode layer that are stacked on the first reflecting electrode in sequence, the first electrode layer being a transparent electrode layer, and the organic light-emitting functional layer including an electron injection layer, an electron transport layer, a light emission layer, a hole injection layer and a hole transport layer; forming an insulating layer between the first reflecting electrode and the first electrode layer, and the insulating layer being of light transmitted, such that light emitted from the organic light-emitting functional layer passes through the insulating layer and arrives at the first reflecting electrode so as to be reflected by the first reflecting electrode; forming a pixel circuit on the base substrate, the pixel circuit including a driving transistor, the driving transistor including a semiconductor layer, a source electrode and a drain electrode, and one of the source electrode and the drain electrode and the first reflecting electrode being electrically connected with each other, and the semiconductor layer being located in the base substrate; and forming a storing capacitor on the base substrate, the storing capacitor being configured to store a data signal. The manufacturing method further comprises: forming a plurality of second reflecting electrodes in the edge area; and forming a light shielding layer on one side of the plurality of reflecting electrodes away from the base substrate.

In the embodiment, an arrangement manner, specific structures or materials of the first electrode layer, the light-emitting element, the second electrode layer, the insulating layer, the first reflecting electrode, the second reflecting electrode, the pixel circuit and the storing capacitor may refer to those in the previous embodiments, which will not be repeated here.

In an existing manufacturing method for a display device, a reflective metal is usually manufactured in the panel factory, which increases difficulty and cost of manufacturing process. In the embodiment, the first reflecting electrode and the first electrode layer are separated by the insulating layer, so that it is possible that a stacked structure including the first reflecting electrode and the insulating layer in the display device is independently manufactured in the wafer factory, moreover, the stacked structure has a surface suitable for manufacturing a light-emitting element, therefore reducing difficulty of manufacturing the first reflecting electrode, and meanwhile, guaranteeing high light output efficiency and high emergent light brightness of the display device.

Figure 10:
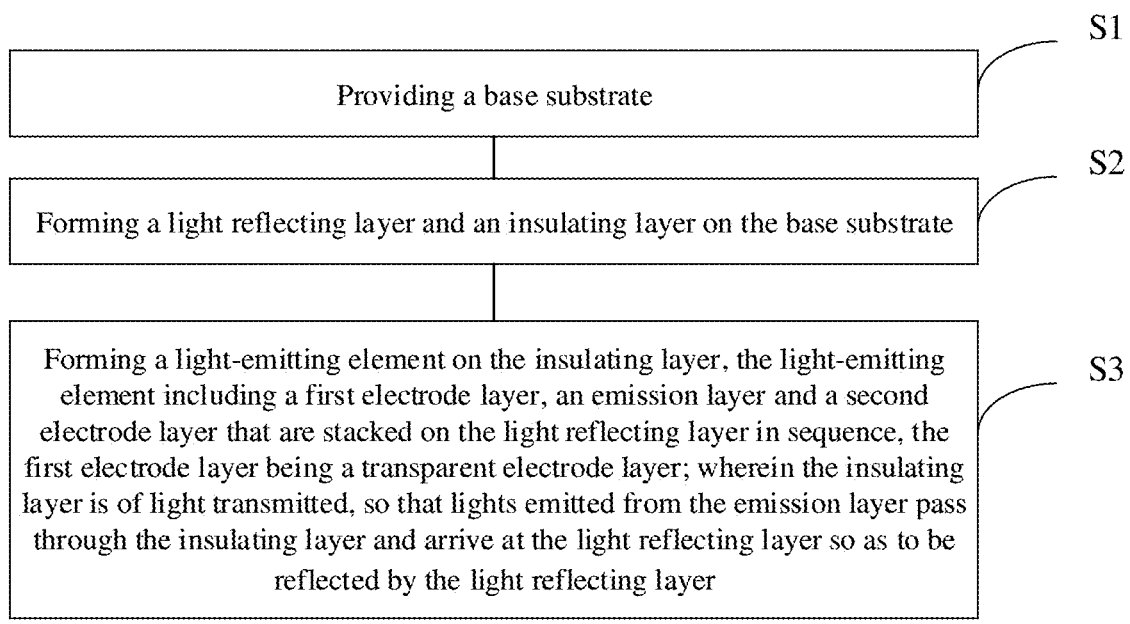
FIG. 10 is a flow diagram of a method for fabricating a sub-pixel of a display device provided by an embodiment of the present disclosure.

As illustrated in FIG. 10, another embodiment of the present disclosure provides a method for fabricating a sub-pixel, including:

Step S1: providing a base substrate.

Step S2: forming a light reflecting layer and an insulating layer on the base substrate; and Step S3: forming a light-emitting element on the insulating layer, the light-emitting element including a first electrode layer, a light emission layer and a second electrode layer that are stacked on the light reflecting layer in sequence, the first electrode layer being a transparent electrode layer; wherein the insulating layer is of light transmitted, such that the light emitted from the organic light-emitting functional layer passes through the insulating layer and arrives at the first reflecting electrode so as to be reflected by the light reflecting layer.

For example, an embodiment of the present disclosure provides a method for fabricating the sub-pixel of a display device in FIG. 2, the method including:

Step 101: providing a base substrate, and forming a first reflecting electrode 106 and an insulating layer 103 on the base substrate 100.

Figure 11:
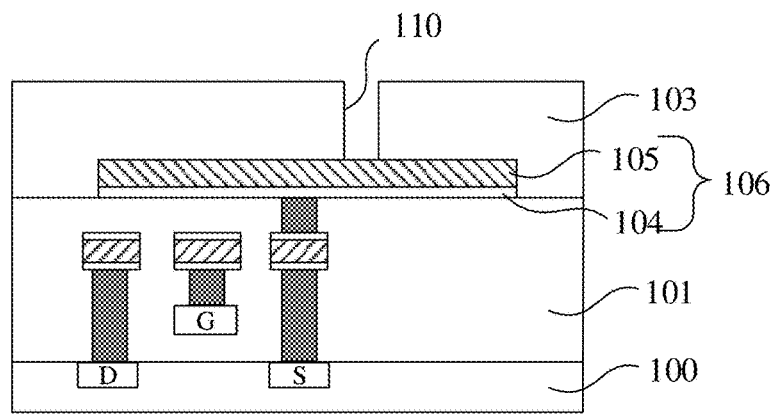
FIG. 11 to FIG. 14 are cross-sectional schematic diagrams of a substrate in respective steps in a method for fabricating a sub-pixel of a display device provided by an embodiment of the present disclosure.
Figure 12:
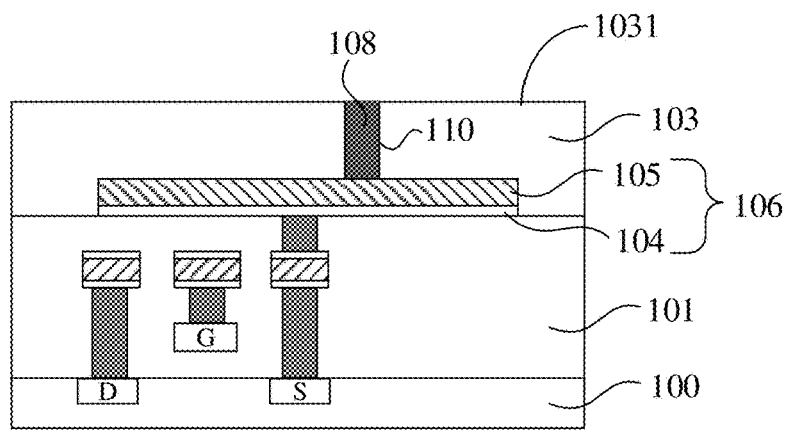

For example, the first reflecting electrode 106 is formed on the base substrate 100. For example, the first reflecting electrode 106 includes a metallic layer 105 and a protective layer 104. The metallic layer 105 and the protective layer 104 may be formed by using a patterning process. In the embodiment of the present disclosure, the patterning process includes but is not limited to a photolithograph process. For example, the photolithograph process includes: coating a to-be-patterned material with a photoresist, exposing the photoresist by utilizing a mask, developing the photoresist to remove part of the photoresist, and etching part of the to-be-patterned material, and stripping off the remaining photoresist. Next, the insulating layer 103 is formed on the first reflecting electrode 106. For example, forming the insulating layer 103 includes: forming a via 110 in the insulating layer 103, as illustrated in FIG. 11; and filling a metallic element 108 in the via 110, as illustrated in FIG. 12. Here, a driving substrate having a first surface 1031 suitable for forming a light-emitting element is formed. It can be understood that, in addition to the first reflecting electrode and the insulating layer, other elements, such as a pixel circuit and the like, are further formed on the base substrate, and its specific preparation process will not be discussed in detail here.

Step 102: forming a first electrode layer 122 on the first surface 1031 of the insulating layer 103.

Figure 13:
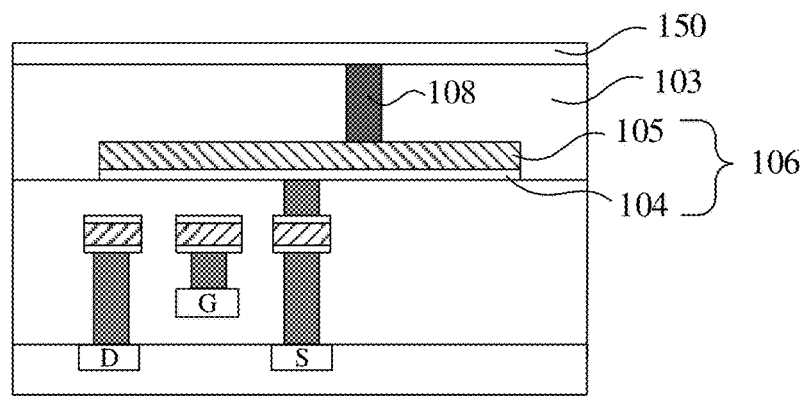
Figure 14:
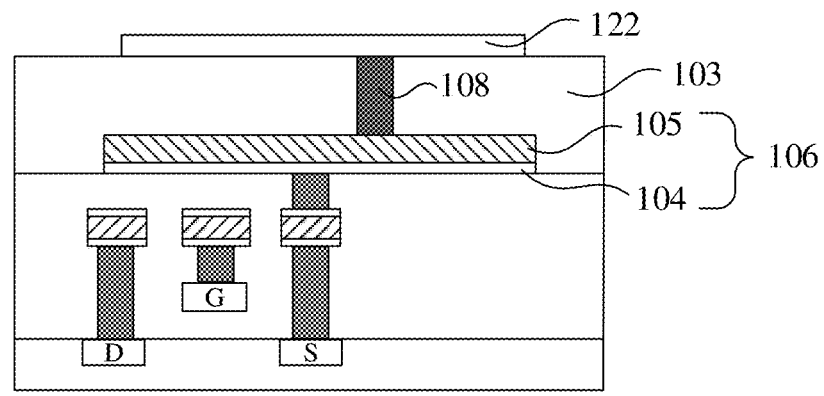

For example, as illustrated in FIG. 13, a first electrode material 150 is formed on one side of the insulating layer 103 away from the base substrate 100; then, the first electrode material 150 is patterned to form the first electrode layer 122, as illustrated in FIG. 14. The first electrode layer 122 covers the via 110 and in contact with the metallic element 108, and the first electrode layer 122 is electrically connected with the first reflecting electrode 106 through the metallic element 108.

Step 103: forming an organic light-emitting functional layer 124 and a second electrode layer 126 on one side of the first electrode layer 122 away from the base substrate in sequence, as illustrated in FIG. 2.

In the manufacturing method of the embodiment, step 101 can be executed in the wafer factory, such that a driving substrate having the first surface 1031 suitable for forming the light-emitting element is obtained in the wafer factory. Next, steps 102 and 103 are executed in the panel factory, that is, the panel factory manufactures and packages the light-emitting element on the driving substrate obtained in the step 101, thereby obtaining a final display device. Compared with the existing manufacturing method for a display device, because the first reflecting electrode can be manufactured in the wafer factory, the manufacturing method of the embodiment not only reduces difficulty and cost of manufacturing the first reflecting electrode, but also guarantees high light output efficiency of the display device.

Figure 15:
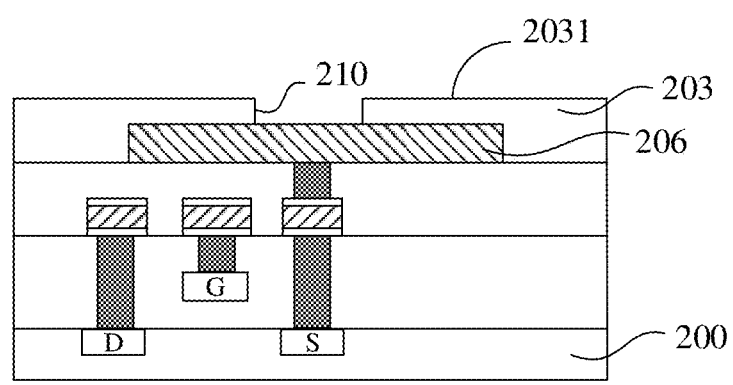
FIG. 15 to FIG. 17 are cross-sectional schematic diagrams of a substrate in respective steps in a method for fabricating a sub-pixel of a display device provided by another embodiment of the present disclosure.

For example, another embodiment of the present disclosure provides a method for fabricating a sub-pixel in FIG. 3, the method including:

Step 201: as illustrated in FIG. 15, providing a base substrate, and forming a first reflecting electrode 206 and an insulating layer 203 on the base substrate 200.

For example, the first reflecting electrode 206 is formed on the base substrate 200 on which a pixel circuit is formed. For example, the first reflecting electrode 106 includes only a metallic layer. Next, the insulating layer 203 is formed on the first reflecting electrode 206. For example, the forming the insulating layer 203 further includes: forming a first opening 210 in the insulating layer 203, the first opening 210 exposing the first reflecting electrode 206. As illustrated in FIG. 15, part of a surface of the first reflecting electrode 206 away from the base substrate 200 is exposed by the first opening 210. Here, a driving substrate having a first surface 2031 suitable for forming a light-emitting element is formed.

Step 202: forming a first electrode layer 222 on the first surface 2031 of the insulating layer 203.

Figure 16:
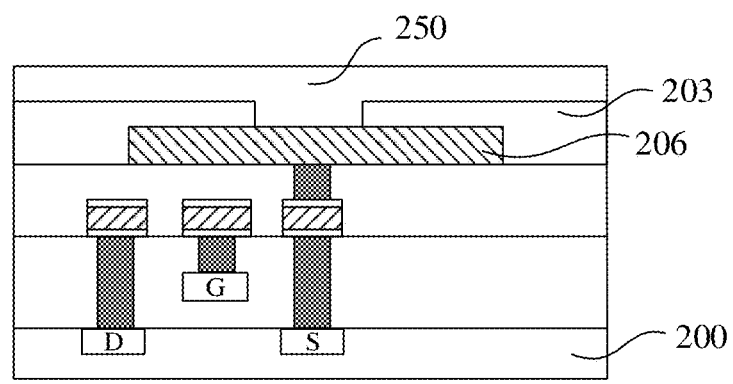
Figure 17:
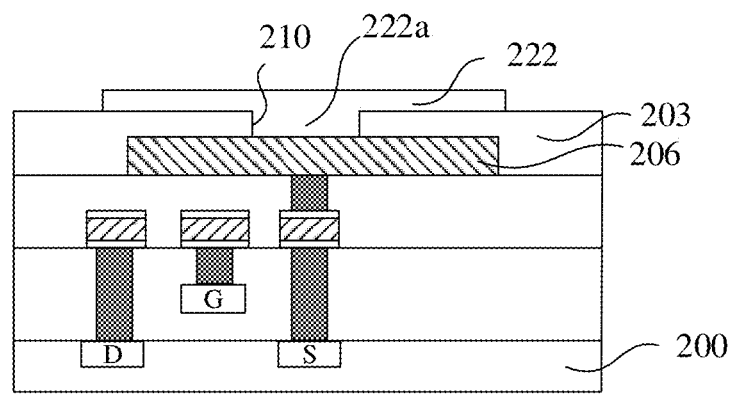

For example, as illustrated in FIG. 16, a first electrode material 250 is formed on one side of the insulating layer 203 away from the base substrate 200. Then, the first electrode material 250 is patterned to form the first electrode layer 222, as illustrated in FIG. 17. The first electrode layer 222 overlays the first opening 210, and at least one portion 222a of the first electrode layer 222 is formed in the first opening 210 and is electrically connected with the first reflecting electrode 206.

Step 203: forming a light emission layer 224 and a second electrode layer 226 on one side of the first electrode layer 222 away from the base substrate in sequence, as illustrated in FIG. 3.

In the manufacturing method of the embodiment, the step 201 can be executed in the wafer factory, and a driving substrate having the first surface 2031 suitable for forming the light-emitting element is obtained in the wafer factory. Next, the steps 202 and 203 are executed in the panel factory, and the panel factory manufactures and packages the light-emitting element on the driving substrate obtained in the step 201, thereby obtaining a final display device. Compared with the existing manufacturing method for a display device, because the first reflecting electrode can be manufactured in the wafer factory, the manufacturing method not only reduces difficulty and cost of manufacturing the first reflecting electrode, but also guarantees high light output efficiency of the display device.

A further embodiment of the present disclosure provides a driving substrate, which is suitable for driving a light-emitting element to emit light, and comprising: a base substrate, an active area and an edge area. Herein, the active area includes a plurality of sub-pixels located on the base substrate. Herein, each sub-pixel includes: a first reflecting electrode, the first reflecting electrode being located on the base substrate; an insulating layer, the insulating layer being located on one side of the first reflecting electrode away from the base substrate, the insulating layer having a first surface suitable for forming the light-emitting element, and the insulating layer being of light transmitted, such that the light emitted from the organic light-emitting functional layer passes through the insulating layer and arrives at the first reflecting electrode so as to be reflected by the first reflecting electrode; a pixel circuit, the pixel circuit being located on the base substrate and including a driving transistor, the driving transistor including a semiconductor layer, a source electrode and a drain electrode, one of the source electrode and the drain electrode is electrically connected with the first reflecting electrode, and the semiconductor layer being located in the base substrate; and a storing capacitor, the storing capacitor being located on the base substrate and configured to store a data signal. Herein, the edge area surrounds the active area and includes a plurality of second reflecting electrodes located on the base substrate; and a light shielding layer provided on one side of the plurality of second reflecting electrodes away from the base substrate.

In the embodiment, because the first reflecting electrode is provided in driving substrate, and the insulating layer has the first surface suitable for forming the light-emitting element, the first reflecting electrode can be integrated in the driving substrate and manufactured by the wafer factory, which not only reduces the manufacturing cost and difficulty of the first reflecting electrode, but also guarantees high emergent light brightness and high light output efficiency of the display device.

For example, as illustrated in FIG. 12, a driving substrate comprises a base substrate 100, a first reflecting electrode 106 and an insulating layer 103. The insulating layer 103 includes a via 110 filled with a metallic element 118, and the metallic element 118 and the first reflecting electrode 106 are electrically connected with each other. Thus, the insulating layer 103 has a first surface 1031 suitable for forming a light-emitting element 130.

For example, as illustrated in FIG. 15, a driving substrate comprises a base substrate 200, a first reflecting electrode 206 and an insulating layer 203. The insulating layer 203 includes a first opening 210 exposing the first reflecting electrode 203. Thus, the insulating layer 203 has a first surface 2031 suitable for forming a light-emitting element 230.

In the display device, the method for manufacturing the display device, and the driving substrate provided by the embodiments of the present disclosure, because the insulating layer and the first reflecting electrode are provided, it is possible that the stacked structure including the first reflecting electrode and the insulating layer in the display device is manufactured independently in the wafer factory, and therefore, the difficulty of manufacturing the first reflecting electrode is reduced, and meanwhile, the high light output efficiency and the high emergent light brightness of the display device are guaranteed.

In the disclosure, the following should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and a size of a layer or area may be enlarged or narrowed, that is, the drawings are not drawn in a real scale.

(3) In case of no conflict, features in one embodiment or in different embodiments can be combined as a new embodiment.

What is described above is related to the illustrative embodiments of the disclosure only and not limitative to the scope of the disclosure; the scopes of the disclosure are defined by the accompanying claims.

The invention claimed is:

1. A display device, comprising:
    a base substrate;
    an active area, the active area comprising a plurality of sub-pixels on the base substrate, and each of the plurality of sub-pixels comprising:
        a first reflecting electrode;
        a light-emitting element on the first reflecting electrode, the light-emitting element comprising a first electrode layer, an organic light-emitting functional layer and a second electrode layer stacked on the first reflecting electrode in sequence, the first electrode layer being a transparent electrode layer, and the organic light-emitting functional layer comprising an electron injection layer, an electron transport layer, a light emission layer, a hole injection layer and a hole transport layer;
        an insulating layer between the first reflecting electrode and the first electrode layer, the insulating layer being of light transmitted, such that light emitted from the organic light-emitting functional layer passes through the insulating layer and arrives at the first reflecting electrode so as to be reflected by the first reflecting electrode;
        a pixel circuit on the base substrate, the pixel circuit comprising a driving transistor, the driving transistor comprising a semiconductor layer, a source electrode and a drain electrode, one of the source electrode and the drain electrode being electrically connected with the first reflecting electrode, and the semiconductor layer being in the base substrate; and
        a storing capacitor on the base substrate;

an edge area surrounding the active area, the edge area comprising:
   a sensing area, wherein a second reflecting electrode pattern is located in the sensing area, and the second reflecting electrode pattern comprises a plurality of second reflecting electrodes spaced apart from one another, the plurality of second reflecting electrodes are on the base substrate, orthographical projections of all the plurality of second reflecting electrodes on the base substrate are non-overlapped with the active area; and
   a light shielding layer on one side of the plurality of second reflecting electrodes away from the base substrate, wherein an orthographical projection of the light shielding layer on the base substrate is within the edge area and the light shielding layer comprises at least two color film layers that have different colors,
   wherein orthographical projections of the plurality of sub-pixels are within an orthographical projection of the edge area on the base substrate, and the light shielding layer is on a side of the second electrode layer facing away from the base substrate.

2. The display device according to claim 1, wherein the insulating layer comprises a via filled with a metallic element, the first reflecting electrode is electrically connected with the first electrode layer through the metallic element.

3. The display device according to claim 1, wherein the insulating layer comprises a first opening for exposing the first reflecting electrode, and at least a portion of the first electrode layer is in the first opening and is electrically connected with the first reflecting electrode.

4. The display device according to claim 1, wherein entire of the first reflecting electrode is separated from and insulated from the first electrode layer by the insulating layer.

5. The display device according to claim 1, further comprising at least one wiring layer, wherein the at least one wiring layer is between the first reflecting electrode and the base substrate.

6. The display device according to claim 4, further comprising a bonding area and a bonding pad located in the bonding area, wherein the insulating layer comprises a second opening for exposing the bonding pad.

7. The display device according to claim 1, wherein the first reflecting electrode and the second reflecting electrode each comprises a metallic layer, the metallic layers in the first reflecting electrode and the second emitting electrode are arranged in a same layer.

8. The display device according to claim 7, wherein a material of the metallic layer is aluminum or an aluminum alloy.

9. The display device according to claim 8, wherein the first reflecting electrode and the second reflecting electrode each further comprises at least one protective layer, the at least one protective layer and the metallic layer are stacked with each other, and the protective layer is provided on one side of the metallic layer adjacent to the base substrate.

10. The display device according to claim 1, wherein an orthographic projection of the first electrode layer on a plane where the base substrate is located is within an orthographic projection of the first reflecting electrode on the plane where the base substrate is located.

11. The display device according to claim 1, wherein a pattern density of a plurality of first reflecting electrodes is equal to a pattern density of a plurality of second reflecting electrodes.

12. The display device according to claim 1, wherein the light shielding layer comprises at least two color film layers that are stacked with each other, and the base substrate is a silicon-based substrate.

13. A driving substrate suitable for driving a light-emitting element to emit light, the driving substrate comprising:
   a base substrate,
   an active area, the active area comprising a plurality of sub-pixels on the base substrate, and each of the plurality of sub-pixels comprising:
      a first reflecting electrode on the base substrate;
      an insulating layer on one side of the first reflecting electrode away from the base substrate, the insulating layer having a first surface suitable for forming the light-emitting element, the insulating layer being of light transmitted, such that the light emitted from the organic light-emitting functional layer passes through the insulating layer and arrives at the first reflecting electrode to be reflected by the first reflecting electrode;
      a pixel circuit on the base substrate, the pixel circuit comprising a driving transistor, the driving transistor comprising a semiconductor layer, a source electrode and a drain electrode, one of the source electrode and the drain electrode being electrically connected with the first reflecting electrode, and the semiconductor layer being located in the base substrate; and
      a storing capacitor on the base substrate;
   an edge area surrounding the active area, the edge area comprising:
      a sensing area, wherein a second reflecting electrode pattern is located in the sensing area, and the second reflecting electrode pattern comprises a plurality of second reflecting electrodes spaced apart from one another, the plurality of second reflecting electrodes are on the base substrate, orthographical projections of all the plurality of second reflecting electrodes on the base substrate are non-overlapped with the active area; and
      a light shielding layer on one side of the plurality of second reflecting electrodes away from the base substrate, wherein an orthographical projection of the light shielding layer on the base substrate is within the edge area and the light shielding layer comprises at least two color film layers that have different colors,
      wherein orthographical projections of the plurality of sub-pixels are within an orthographical projection of the edge area on the base substrate, and the light shielding layer is on a side of the second electrode layer facing away from the base substrate.

14. The driving substrate according to claim 13, wherein the insulating layer comprises a via filled with a metallic element, the metallic element and the first reflecting electrode are electrically connected with each other.

15. The display device according to claim 1, wherein a thickness of one of the at least two color film layers is smaller than that of a color film layer having the same color in the active area.

* * * * *